United States Patent [19]

Metz et al.

[11] Patent Number: 4,491,803
[45] Date of Patent: Jan. 1, 1985

[54] CURRENT-LIMITING MECHANISM FOR A PRECISION DIFFERENTIAL AMPLIFIER

[75] Inventors: Arthur J. Metz, Gervais; Kenneth G. Schlotzhauer, Beaverton, both of Oreg.

[73] Assignee: Tektronix, Inc., Beaverton, Oreg.

[21] Appl. No.: 444,768

[22] Filed: Nov. 26, 1982

[51] Int. Cl.³ .............................................. H03F 3/45
[52] U.S. Cl. .................................. 330/261; 330/149
[58] Field of Search ............... 330/149, 254, 261, 260

[56] References Cited

FOREIGN PATENT DOCUMENTS 147012 11/1980 Japan .................................. 330/254

Primary Examiner—James B. Mullins
Attorney, Agent, or Firm—George T. Noe

[57] ABSTRACT

A current-limiting circuit for a differential amplifier includes a voltage generator which is switched in parallel with a signal-current-generating impedance connected between the emitters of the differential amplifier transistors whenever an input signal exceeds the voltage of the voltage generator. A practical embodiment for limiting the current in either direction for opposite-polarity input signals includes a pair of voltage generators cross-coupled from a respective differential amplifier transistor base to the opposite transistor emitter via transistor switches.

4 Claims, 4 Drawing Figures

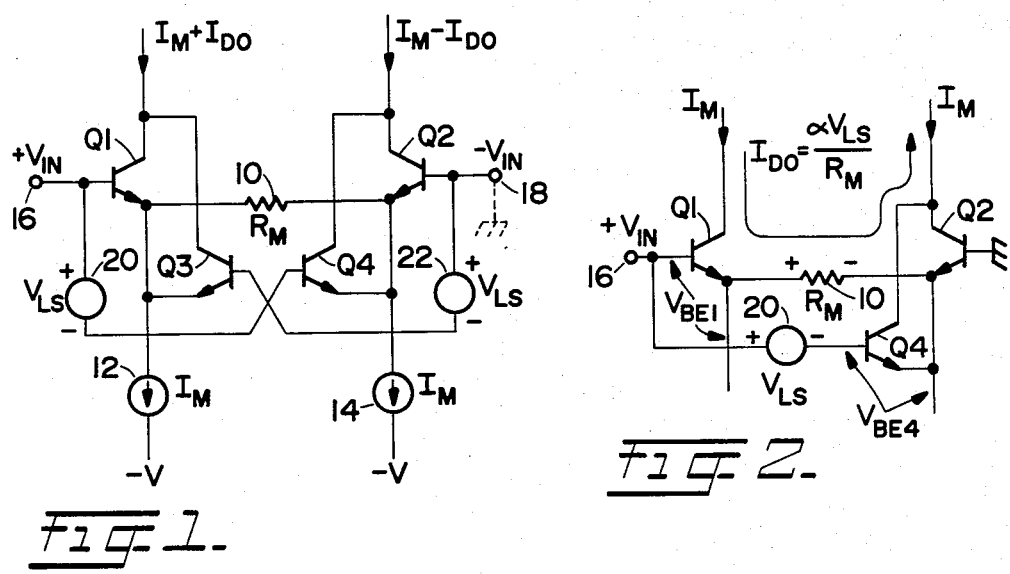
Fig. 1.
Fig. 2.
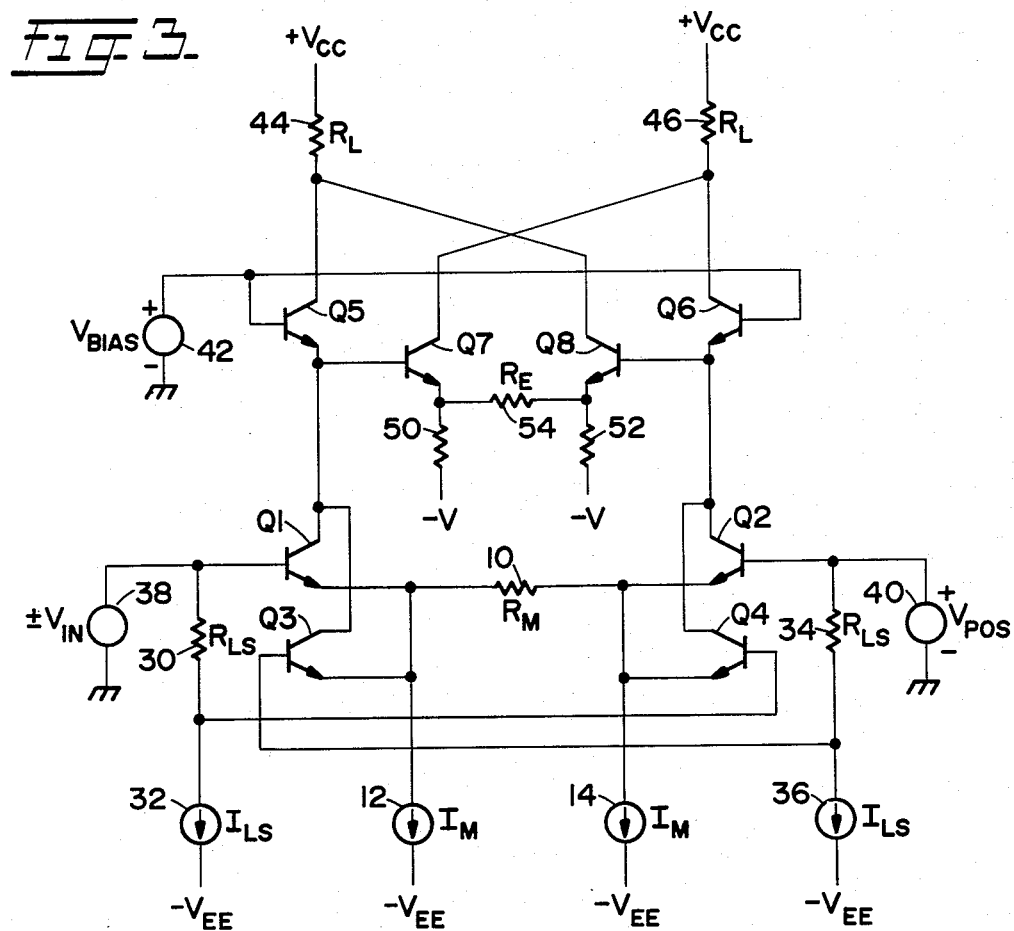
Fig. 3.

CURRENT-LIMITING MECHANISM FOR A PRECISION DIFFERENTIAL AMPLIFIER

BACKGROUND OF THE INVENTION

High-precision wideband differential amplifiers have broad application in modern electronic equipment, particularly in measurement instruments such as oscilloscopes. One amplifier design which provides vastly improved performance, particularly in reduced nonlinearity and thermal distortion error, is the cascode feedforward amplifier known in the industry as the "cascomp" amplifier taught by Patrick A. Quinn in U.S. Pat. No. 4,146,844, which is assigned to asignee of the present invention. One useful application of the cascomp amplifier is in the horizontal deflection amplifier circuit of a wide bandwidth oscilloscope. When using the oscilloscope to provide a horizontally-magnified display (magnified sweep mode), the horizontal amplifier is almost always overdriven, and the problem is that the magnifying amplifier must limit the current drive to the shunt feedback output stages to prevent the output amplifiers from going out of regulation due to saturation or cutoff of transistors in the loop, which would cause severe overdrive recovery problems.

Another application for a limiting cascomp is in the vertical chain either in the channel switch or the vertical output stage. In a so-called "add" mode, full dynamic range of both channels is necessary; however, this criterion causes subsequent stages to be greatly overdriven. The present invention limits the vertical signal after the adder stage to prevent transient-response and thermal-distortion recovery problems when overdrive conditions exist.

Thus it would be desirable to provide a cascomp amplifier which when overdriven provides a well-defined, well-behaved current limiting function.

SUMMARY OF THE INVENTION

In accordance with the present invention, a differential amplifier such as a cascomp amplifier is provided with a limiting circuit that ensures that the magnitude of the maximum output differential current is well defined and less than the output quiescent current. The current-limiting mechanism provided by the present invention has useful application in situations in which a shunt feedback amplifier is driven by a differential stage, such as in the horizontal deflection amplifier of an oscilloscope, or in channel switch applications.

The differential amplifier to be current limited includes an emitter-coupled pair of transistors with a predetermined signal-current-producing resistor $R_m$ connected between the emitters thereof. The current-limiting mechanism comprises an additional pair of transistors, each of which is connected across (collector to emitter) a respective one of the differential amplifier transistors, and a pair of voltage sources of predetermined value, each of which is cross connected from a respective differential amplifier transistor base to the base of an opposite current-limiting transistor. This mechanism thus limits the maximum voltage developed across emitter resistor $R_m$ to that of one of the predetermined voltage sources.

Useful amplifier configurations employing the current-limiting mechanism of the present invention include, in addition to cascode driven shunt feedback amplifiers, the Quinn cascomp amplifier taught in U.S. Pat. No. 4,146,844 and the cascomp amplifier modified to correct alpha-induced error as taught by Schlotzhauer and Metz in U.S. Pat. No. 4,322,688.

It is therefore one object of the present invention to provide a current-limiting mechanism for a precision differential amplifier.

It is another object of the present invention to provide current limiting with good overdrive recovery characteristics for amplifiers.

It is another object of the present invention to provide a current-limiting mechanism for a differential amplifier which is simple in construction and easily integrable with the amplifier components in an integrated circuit.

Other objects, features, and advantages of the present invention will become apparent to those having ordinary skill in the art upon a reading of the following description when taken in conjunction with the accompanying drawings.

BRIEF DESCRIPTION OF THE DRAWINGS

FIG. 1 shows a differential amplifier incorporating a current-limiting mechanism in accordance with the present invention;

FIG. 2 shows a partial amplifier illustrating one loop of the current-limiting mechanism.

FIG. 3 shows a cascomp amplifier employing the current-limiting mechanism of the present invention.

DETAILED DESCRIPTION OF THE PRESENT INVENTION

Figure 4:
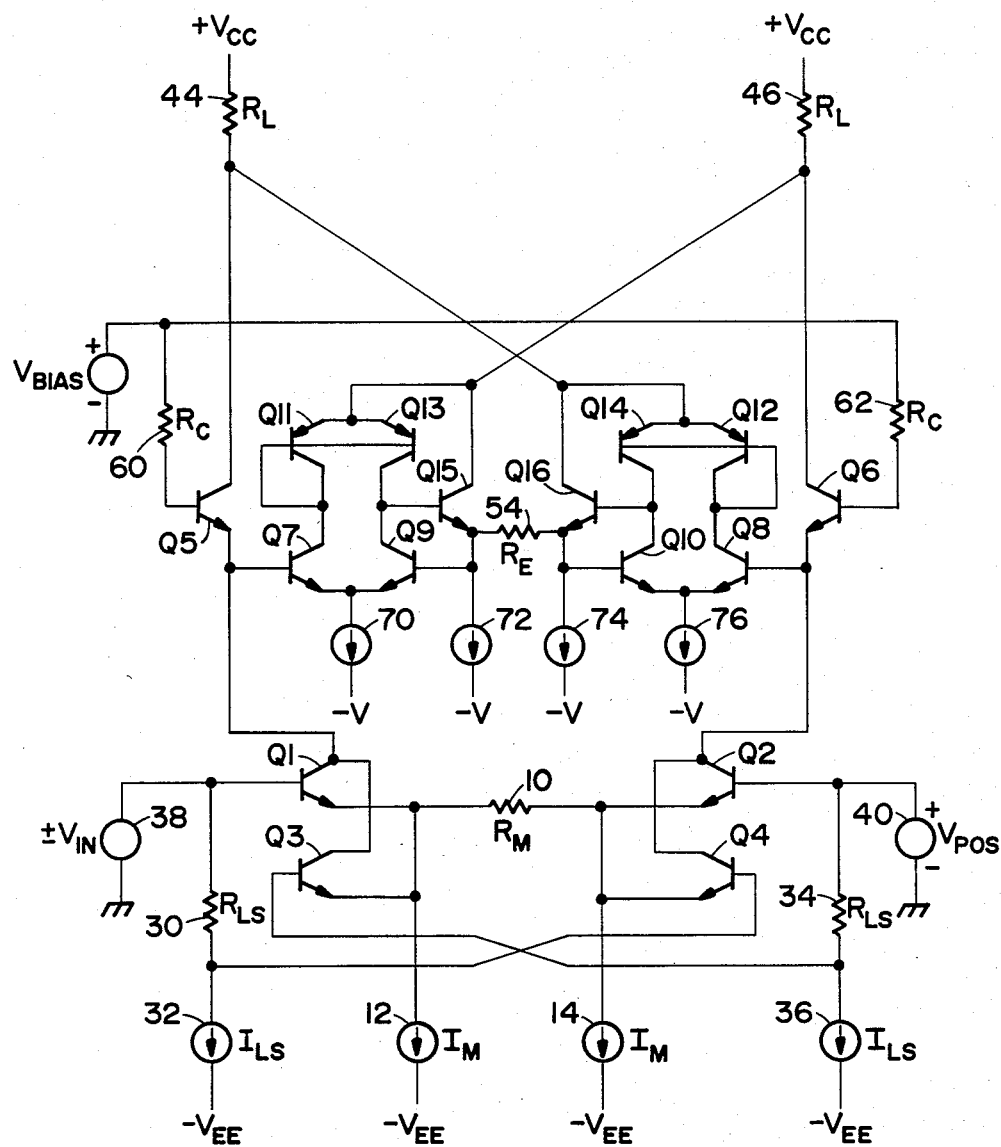
FIG. 4 shows a cascomp amplifier modified to reduce alpha-induced error, also incorporating the current-limiting mechanism of the present invention.

Referring now to FIG. 1, there is shown a differential amplifier comprising a pair of transistors Q1 and Q2, the emitters of which are coupled together through a resistor 10. The emitters of transistors Q1 and Q2 are also connected to a suitable source of negative voltage through respective current sinks 12 and 14. Current sinks 12 and 14 provide the necessary standing or quiescent current $I_m$ for each of the transistors Q1 and Q2, respectively. The base of transistor Q1 is connected to an input terminal 16, to which an input signal voltage $+V_{IN}$ is applied, and, similarly, the base of transistor Q2 is connected to an input terminal 18, to which an input signal $-V_{IN}$ is applied. Thus $+V_{IN}$ and $-V_{IN}$ constitute an input differential signal. Connected to terminal 18 is a phantom ground, indicating that terminal 18 may be grounded, and a single-ended input signal $\pm V_{IN}$ may be applied to input terminal 16. The collectors of transistors Q1 and Q2 are shown unconnected; however, it is implied that these collectors may be connected to load elements or upper cascade-connected transistors in a conventional manner. The input differential signal is developed across emitter resistors 10, producing a differential output signal current $I_{DO}$, indicated in the collector paths along with standing current $I_M$ as + and $-I_{DO}$.

The current limiting mechanism comprises transistors Q3 and Q4, and voltage sources 20 and 22. Transistor Q3 is connected across transistor Q1 such that the emitters are connected together and the collectors are connected together. Similarly, transistor Q4 is connected across transistor Q2 such that the emitters are connected together and the collectors are connected together. Voltage source 20 is connected between the bases of transistors Q1 and Q4, and voltage source 22 is connected between the bases of transistors Q2 and Q3.

Ignoring the current-limiting mechanism for the moment, note that if the differential input signal $V_{IN}$ is sufficiently large (observing the polarities shown), the value of $-I_{DO}$ approaches and surpasses the value of $I_M$ in the collector of transistor Q2, cutting transistor Q2 off. Thus it may be said that if, without any current-limiting mechanism, the condition $V_{IN}/R_M 22 > I_M$ is reached, either transistor Q1 or Q2 would be cut off.

To understand the current-limiting mechanism of the present invention, refer to FIG. 2, wherein a partial schematic of the FIG. 1 circuit configuration is shown. Like reference numerals are retained for like components. In FIG. 2, the base of transistor Q2 is grounded, and a positive-going input signal $+V_{IN}$ is applied to input terminal 16. The circuit values are chosen such that as long as $V_{IN}$ is less than $V_{LS}$, $I_{DO} = V_{IN}/R_M$ and $I_{DO} < I_M$. When $V_{IN}$ is equal to, or exceeds $V_{LS}$, then voltage source 20 and transistor Q4 act to limit the differential output current $I_{DO}$ in the following manner: Collecting voltage terms clockwise around the loop composed of transistors Q1 and Q4, resistor 10, and voltage source 20, $$-V_{BE1} - I_{DO}R_M + V_{BE4} + V_{LS} = 0. \qquad (1)$$

Rearranging the terms, $$I_{DO} = (V_{LS} - V_{BE1} + V_{BE4})/R_M. \qquad (2)$$

If the base-emitter junctions of transistors Q1 and Q4 are scaled to be substantially identical, then $$I_{DO} = V_{LS}/R_M. \qquad (4)$$

The foregoing analysis does not take into account the base current of transistor Q1, and more generalized equations may be developed by including an alpha term, wherein alpha ($\alpha$) is defined as the common-base forward current transfer ratio from emitter to collector. Since part of the current flowing through the base-emitter junction does not reach the collector, but rather flows out of the base as base current, alpha is necessarily less than unity, however slight. Therefore, equation (2) may be modified such that $$I_{DO} = \alpha_1(V_{LS} - V_{BE1} + V_{BE4})/R_M,$$

where $\alpha_1$ is the alpha of transistor Q1. More specifically, $$I_{DO} = \alpha_1 \left[ V_{LS} + V_{T4}\ln\left(\frac{\alpha_4 I_M - I_{DO}}{I_{S4}}\right) - V_{T1}\ln\left(\frac{\alpha_1 I_M + I_{DO}}{I_{S1}}\right) \right] /R_M, \qquad (5)$$

where $\alpha_1$ and $\alpha_4$ are the alpha parameters, $V_{T1}$ and $V_{T4}$ are the volt-equivalent of absolute temperature, and $I_{S1}$ and $I_{S4}$ are the forward saturation current parameters, of transistors Q1 and Q4, respectively. Ideally, the operating parameters should be scaled substantially the same for all $= \alpha_2 = \alpha_3 = \alpha_4$, and thermal conditions $T = T_1 = T_2 = T_3 = T_4$. Setting $$\left(\frac{I_{S4}}{I_{S1}}\right) = \frac{\alpha I_M - I_{DO}}{\alpha I_M + I_{DO}},$$

a manipulation of equation (5) yields $$I_{DO} = \alpha V_{LS}/R_M, \qquad (6)$$

and $$\frac{I_{S4}}{I_{S1}} = \frac{I_M - V_{LS}/R_M}{I_M + V_{LS}/R_M}.$$

Thus, for appropriate scaling of transistors Q3 and Q4 to transistors Q1 and Q2, equation (4) is valid.

FIG. 3 shows the current-limiting mechanism hereinabove described applied to the Quinn cascomp different amplifier including main-amplifier transistors Q5 and Q6, and error-amplifier transistors Q7 and Q8 connected as described in U.S. Pat. No. 4,146,844. Voltage source 20 is replaced by an equivalent series combination of a resistor 30 and a current source 32, which is easily fabricated in integrated circuit form. Similarly, voltage source 22 is replaced by an equivalent series combination of a resistor 34 and a current source 36. Assuming values of $R_{LS}$ for resistors 30 and 34, and $I_{LS}$ for current sources 32 and 36, then $I_{LS}R_{LS} = V_{LS}$. The input signal is represented by a signal generator 38 applied to the base of transistor Q1, while a voltage source 40 generating a voltage $+V_{POS}$ is connected to the base of transistor Q2. The main amplifier transistors Q5 and Q6 of the cascomp stage are operated as common-base amplifiers, and thus the bases thereof are connected together to a suitable bias voltage source 42. Output voltage signals may be developed across load resistors 44 and 46. The error amplifier Q7-Q8 includes respective emitter resistors 50 and 52 which each produce a quiescent current approximately equal to $I_M$, and an emitter-coupling resistor 54 connected between the emitters of transistors Q7 and Q8. Looking at the cascomp amplifier for a moment, note that if either transistor Q5 or Q6 were allowed to turn off, a large beta-dependent error signal would be applied to the error amplifier transistors Q7 and Q8, causing poor overdrive recovery and a poorly defined clamp limit on the output current swing. Here, the limiting action of transistors Q3 and Q4 in conjunction with the constant voltage drop of resistors 30 and 34 prevents transistors Q5 and Q6 from turning off. It is true, however, that transistors Q5 and Q6 could be kept on by pull-down resistors or current sources connected to the emitters thereof, but this would significantly degrade the error correction features of the cascomp amplifier because the currents flowing through transistors Q1 and Q5 (Q2 and Q6) would not match. By limiting the current under overdrive conditions in accordance with the present invention, as the amplifier comes out of clamp, the error correction function operates as it should.

A precision cascomp amplifier modified to reduce alpha-induced error, and also incorporating an input differential amplifier with the current-limiting mechanism of the present invention, is shown in FIG. 4. Here, the differences over the configuration of FIG. 3 include error-voltage generating resistors 60 and 62 to provide a correction current as taught in U.S. Pat. No. 4,322,688. The error amplifier is improved with the addition of transistors Q9 and Q16 and current sources 70–76 to reduce the beta dependence of the clamp limit by reducing base current in the error-sensing transistors Q5 and Q6, allowing tighter control over limit values. The additional transistors serve also to linearize the error amplifier thereby to improve overall amplifier linearity—an important feature because the error amplifier is capable of producing a very large percentage of the total output swing.

It can be appreciated that the differential amplifier with a current-limiting mechanism in accordance with the present invention is applicable to other circuit configurations, such as a cascomp amplifier modified by applying a fraction of the input signal $V_{IN}$ to the bias voltage of transistors Q5 and Q6. Accordingly, while we have shown and described our invention in some useful operating environments, it will be apparent to those skilled in the art that many changes may made without departing from our invention in its broader aspects. The appended claims therefore cover all such changes and modifications as fall therewithin.

What we claim as being novel is:

1. A current-limiting circuit for a differential amplifier which includes an emitter-coupled pair of transistors and a signal-current-generating impedance coupled between the emitters of said pair of transistors, comprising:

means for generating a predetermined fixed voltage coupled from the base of at least one of said pair of transistors to the emitter of the opposite transistor of said pair; and means for connecting said voltage-generating means in parallel with said impedance when the input signal voltage applied to said differential amplifier exceeds a predetermined fixed voltage, said connecting means comprising electronic switch means interposed between said voltage-generating means and said emitter of said opposite transistor.

2. A current-limiting circuit in accordance with claim 1 wherein said electronic switch means comprises at least a third transistor, the emitter and collector of which are connected to the emitter and collector, respectively, of said opposite transistor, and the base of which is connected to said voltage-generating means.

3. A current-limiting circuit in accordance with claim 2 wherein said electronic switch means further comprises a fourth transistor connected to said one of said pair of transistors, and said voltage generating means is also coupled from the base of said opposite transistor to the base of said fourth transistor.

4. A current-limiting circuit in accordance with claim 3 wherein said voltage-generating means comprises a pair of voltage generators of opposite polarities so that said signal current is limited in both directions through said impedance.

* * * * *

UNITED STATES PATENT AND TRADEMARK OFFICE
CERTIFICATE OF CORRECTION

PATENT NO. : 4,491,803

DATED : January 1, 1985

INVENTOR(S) : Arthur J. Metz, Kenneth G. Schlotzhauer

It is certified that error appears in the above—identified patent and that said Letters Patent is hereby corrected as shown below:

Column 3, line 9 reads "$V_{IN}/R_M 22 > I_M$" should be --$V_{IN}/R_M \gg I_M$--.

Column 3, line 66, delete entire line and replace with --for all four transistors Q1, Q2, Q3, and Q4 so that $Q = Q_1$-- .

Signed and Sealed this

Twenty-second Day of October 1985

[SEAL]

Attest:

DONALD J. QUIGG

Attesting Officer

Commissioner of Patents and Trademarks—Designate